US009645188B2

(12) United States Patent
Takala et al.

(10) Patent No.: US 9,645,188 B2
(45) Date of Patent: May 9, 2017

(54) ARRANGEMENT TO MONITOR DC CIRCUIT CONDITION

(71) Applicant: ABB OY, Helsinki (FI)

(72) Inventors: Marko Takala, Vaasa (FI); Matti Rajala, Ilmajoki (FI); Marko Pylkäs, Vaasa (FI)

(73) Assignee: ABB Oy, Helsinki (FI)

( * ) Notice: Subject to any disclaimer, the term of this patent is extended or adjusted under 35 U.S.C. 154(b) by 741 days.

(21) Appl. No.: 14/058,756

(22) Filed: Oct. 21, 2013

(65) Prior Publication Data

US 2014/0049263 A1    Feb. 20, 2014

Related U.S. Application Data

(63) Continuation of application No. PCT/FI2012/050401, filed on Apr. 23, 2012.

(30) Foreign Application Priority Data

Apr. 21, 2011    (FI) ...................................... 20110144

(51) Int. Cl.
    *G01R 31/02*      (2006.01)
    *H02J 7/00*      (2006.01)
    (Continued)

(52) U.S. Cl.
    CPC ............. *G01R 31/07* (2013.01); *H02H 3/046* (2013.01); *H01H 2085/0266* (2013.01)

(58) Field of Classification Search
    CPC ............ G01R 31/3606; G01R 31/3679; G01R 31/3662; G01R 31/362; G01R 31/3658;
    (Continued)

(56) References Cited

U.S. PATENT DOCUMENTS

| 5,754,384 A | 5/1998 | Ashley |
| RE36,317 E * | 9/1999 | Arratia ................... H01H 85/32 337/206 |

(Continued)

FOREIGN PATENT DOCUMENTS

| CN | 201274274 Y | 7/2009 |
| JP | 63-268469 A | 11/1988 |

(Continued)

OTHER PUBLICATIONS

International Search Report (PCT/ISA/210) mailed on Jul. 25, 2012, by the Finnish Patent Office as the International Searching Authority for International Application No. PCT/FI2012/050401.

(Continued)

*Primary Examiner* — Arleen M Vazquez
*Assistant Examiner* — Taqi Nasir
(74) *Attorney, Agent, or Firm* — Taft Stettinius & Hollister LLP

(57) ABSTRACT

An arrangement for monitoring a condition of a direct current voltage circuit including first and second supply poles for forming an operating voltage. A first fuse is connected to the first supply pole, and has a supply pole and an output pole. A second fuse is connected to the second supply pole, and has a supply pole and an output pole. The arrangement can form one or several reference voltages ($U_{REF}a, U_{REF}b, U_{REF}c$), can form a first measurement voltage ($U_{1a}, U_{1b}, U_{1c}, U_{1d}$) between the output pole of the first fuse and the supply pole of the second fuse, and can form a second measurement voltage ($U_{1a}, U_{1b}, U_{1c}, U_{1d}$) between the output pole of the second fuse and the supply pole of the first or the second fuse. One or several reference voltages and measurement voltages can be compared to estimate a condition of the first and second fuse, and a comparison result can be indicated.

20 Claims, 9 Drawing Sheets

(51) Int. Cl.
*G01R 31/07* (2006.01)
*H02H 3/04* (2006.01)
*H01H 85/02* (2006.01)

(58) Field of Classification Search
CPC ............ G01R 31/3648; G01R 31/3675; G01R 31/3655; G01R 31/3696; H01M 2010/4271; H01M 10/441; H01M 10/448; H01M 2010/4278; H01M 2200/20; B60L 11/1892; B60L 11/1894
USPC ........ 324/550, 507, 403–414, 425–450, 513, 324/523, 528, 750.01, 750.15–750.22, 324/756.01, 762.01, 555
See application file for complete search history.

(56) References Cited

U.S. PATENT DOCUMENTS

| | | | |
|---|---|---|---|
| 6,087,889 A | 7/2000 | Mok | |
| 7,170,299 B1* | 1/2007 | Anand | G11C 17/16 257/E23.149 |
| 2001/0026949 A1* | 10/2001 | Ogawa | H01L 22/20 438/15 |
| 2003/0058598 A1 | 3/2003 | Tamai et al. | |
| 2010/0023284 A1 | 1/2010 | Rodseth et al. | |
| 2010/0244847 A1* | 9/2010 | Kudo | B60L 3/0046 324/433 |
| 2011/0163758 A1* | 7/2011 | Huang | G11C 17/18 324/550 |
| 2011/0187376 A1* | 8/2011 | Barrenscheen | G01R 31/327 324/416 |
| 2012/0001640 A1* | 1/2012 | Hashimoto | B60L 3/0069 324/434 |
| 2012/0092018 A1* | 4/2012 | Scheucher | B60L 8/00 324/426 |
| 2012/0119749 A1* | 5/2012 | Iida | H01M 10/441 324/435 |

FOREIGN PATENT DOCUMENTS

| | | |
|---|---|---|
| JP | 02-041617 A | 2/1990 |
| JP | 05-207646 A | 8/1993 |
| JP | 2010-246218 A | 10/2010 |

OTHER PUBLICATIONS

Search Report issued Jan. 16, 2012 by the Finnish Patent Office in corresponding Finnish Patent Application No. 20110144. (1 page).

* cited by examiner

ARRANGEMENT TO MONITOR DC CIRCUIT CONDITION

RELATED APPLICATION

This application claims priority as a continuation application under 35 U.S.C. §120 to PCT/FI2012/050401, which was filed as an International Application on Apr. 23, 2012 designating the U.S., and which claims priority to Finnish Application 20110144 filed in Finland on Apr. 21, 2011. The entire contents of these applications are hereby incorporated by reference in their entireties

BACKGROUND

The present disclosure is related to the electronic monitoring of fuses, that is, the indication of fuse blowout. Often a blown-out fuse can be noticed quickly by techniques other than through visual inspection of fuses, and in automation systems especially the information on a blown-out fuse can be transmitted automatically.

Some handle-type fuse models include a component which protrudes when the fuse blows out and it can be arranged to transmit the mechanical contact information. However, this is not possible with most fuses, in which case, the condition of the fuse should be assessed by measuring the voltage after the fuse, or current running through the fuse.

In order to recognise a blown-out fuse in an arrangement utilising current measurement, the circuit load is switched on. Alternatively, the voltage can be measured over the fuse, which is in practice 0V with an undamaged fuse. With a blown-out fuse the voltage over the fuse is almost similar to the supply voltage, assuming that the load is switched on.

CN 201274274 Y introduces a fuse monitoring coupling in which an LED controlled by a transistor indicates that the fuse has blown. Such couplings are suitable for circuits with very low voltages and, additionally, the sizing of components is such that the voltage should be relatively stable.

In some applications it is desired that the fuse guard indicates the condition of fuses both in the positive and negative poles of the DC voltage supply. An additional specification may be that the fuse guard can be applied to a very wide range of rated supply voltages or, at least, it should allow even large voltage variations in the supply voltage circuit.

SUMMARY

An arrangement is disclosed for monitoring a condition of a direct current voltage circuit, the arrangement comprising: a first supply pole and a second supply pole for forming an operating voltage for the direct current voltage circuit; a first fuse connected to the first supply pole, which first fuse includes a supply pole and an output pole; a second fuse connected to the second supply pole, which second fuse includes a supply pole and an output pole; means for forming one or several reference voltages ($U_{REF}a, U_{REF}b, U_{REF}c$); means for forming a first measurement voltage ($U_{1a}, U_{1b}, U_{1c}, U_{1d}$) between the output pole of the first fuse and the supply pole of the second fuse; means for forming a second measurement voltage ($U_{1a}, U_{1b}, U_{1c}, U_{1d}$) between the output pole of the second fuse and the supply pole of the first or second fuse; means for comparing one or several reference voltages and measurement voltages to assess conditions of the first and the second fuses; and means for indicating a result of the comparing.

A method is disclosed for monitoring a condition of a direct current voltage circuit, comprising: forming an operating voltage of a direct current voltage circuit between a first supply pole and a second supply pole, to which first supply pole a first fuse has been connected, which first fuse has a supply pole and an output pole, and to which second supply pole a second fuse has been connected, which second fuse has a supply pole and an output pole; forming one or several reference voltages ($U_{REF}a, U_{REF}b, U_{REF}c$); forming a first measurement voltage ($U_{1a}, U_{1b}, U_{1c}, U_{1d}$) between the output pole of the first fuse and the supply pole of the second fuse; forming a second measurement voltage between the output pole of the second fuse and the supply pole of the first or the second fuse; comparing one or several reference voltages and measurement voltages for estimating a condition of the first and second fuses; and indicating a result of the comparing.

BRIEF DESCRIPTION OF THE DRAWINGS

Exemplary preferred embodiments will be disclosed herein, referring to drawings in which.

DETAILED DESCRIPTION

The present disclosure describes exemplary embodiments based on a coupling in which a standard reference voltage is arranged to be created independent of the fuse blowing out; in which a voltage divider coupling is connected to the output pole of the monitored fuse to create a measurement voltage; which coupling includes a comparison element to compare these two voltages and to control an indication element to indicate or forward information on the fuse's condition. The reference voltage and the auxiliary voltage used by the comparison and indication elements can be created, for example, with the help of a zener diode and serial resistance from the supply voltage before the fuse. To achieve a larger rated voltage range without unnecessary power consumption created in the serial resistance, you can affordably use a constant current power source coupling in series with a zener diode. To create a reference and auxiliary voltage, it is also possible to use a separate auxiliary power source, such as a battery, a power source equipped with an AC transformer and rectification, or a DC/DC converter fed from a DC circuit.

Figure 1:
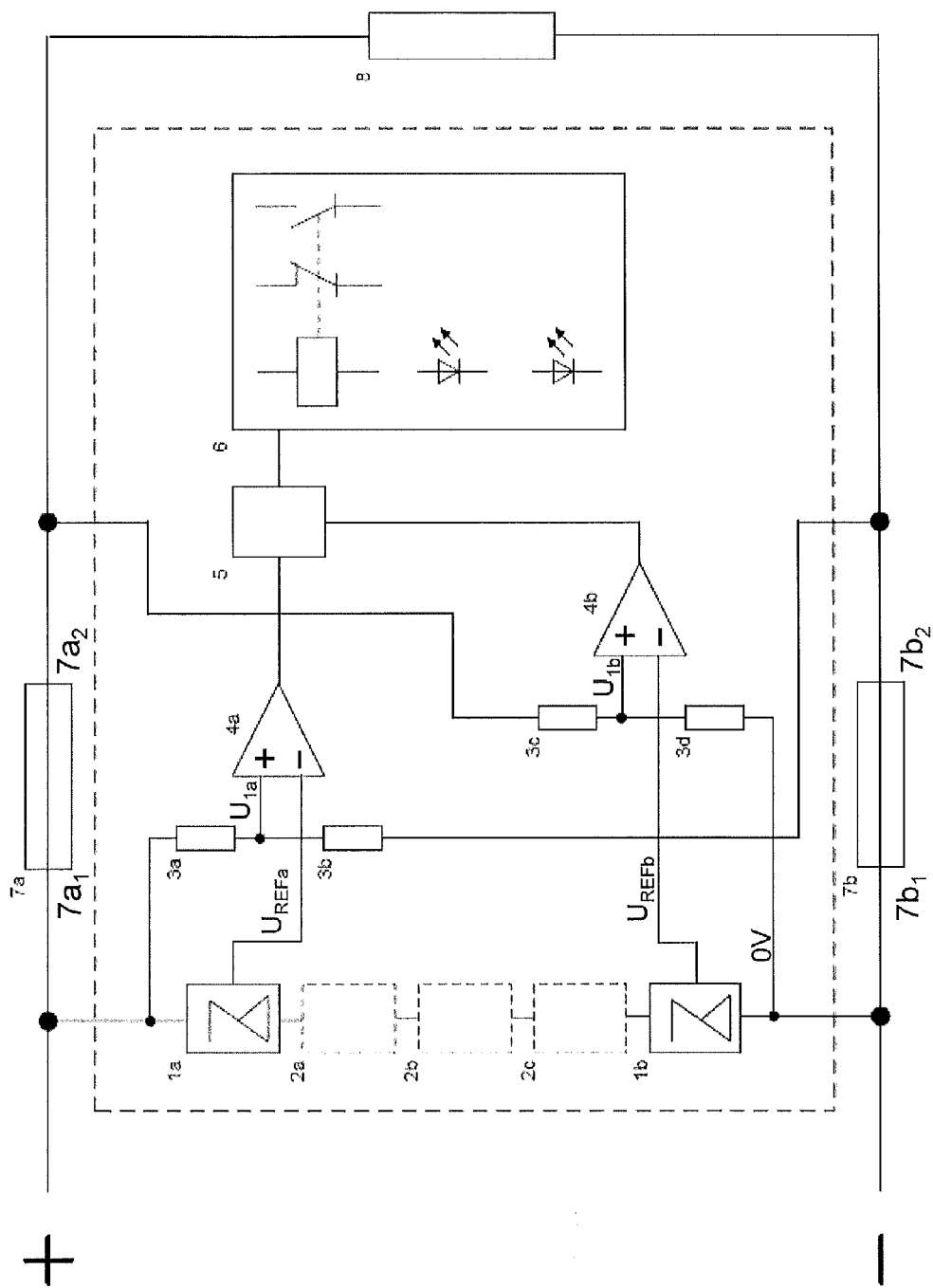
FIG. 1 illustrates an arrangement according to an exemplary embodiment, in which the reference and auxiliary voltage circuit has constant current power sources, and the resistance chains operate as the voltage dividers of the measurement voltage.

Exemplary embodiments disclosed herein can be used to monitor the condition of the DC voltage circuit supply and the fuses connected to the positive and the negative pole. FIG. 1 illustrates a block diagram for the condition monitoring arrangement of fuses connected to the positive and negative supply poles of the DC voltage circuit, in which the reference and auxiliary voltage circuit includes a three-module constant current power source.

The main circuit is created between the positive (+) and negative (−) supply poles of the DC voltage circuit, including the load 8 and the fuses (7a, 7b) which protect the circuit. In principle, already one fuse would be sufficient, but due to, for example, possible earth faults, both poles are often equipped with fuses. In practice, only one of the two fuses blows out because of an overload or a short circuit in the circuit. Therefore, a fuse guard has been arranged to monitor both fuses and to indicate if at least one of them has blown out. The fuse guard and the elements inside it are separated with a dotted line in the diagram.

The monitored fuse 7a has been connected to the positive pole of supply, and the monitored fuse 7b to the negative pole. An auxiliary voltage source (1a,1b) has been connected between the supply poles (+) and (−) to feed the reference voltage ($U_{REF}a, U_{REF}b$) to the inverting input (−) of the comparator (4a,4b) and the auxiliary voltages of the comparator (4a,4b), the logic element 5 and the indication element 6. Three constant current power source modules (2a,2b,2c) have been connected between the auxiliary voltage sources (1a,1b) connected in series. The number of constant current power source modules depends on their internal connection and how high a nominal voltage the arrangement is desired to cover. The use of constant current power sources allows a wider nominal voltage range and greater variation—for example, 110V DC-500V DC±20%.

The supply of the DC voltage circuit is connected to the input poles (7a1,7b1) of fuses (7a,7b), and a circuit forming the reference and auxiliary voltage is also connected between the poles. The output poles ($7a_2, 7b_2$) of the fuses are meant to be the connection points of load 8, but at the same time they are also used for connecting the resistance (3b, 3c) of the first end of the voltage divider connection, which is arranged to form the measurement voltage ($U1_a, U1_b$) of the fuse guard. The resistance (3a,3d) of the other end of the voltage divider connection has been connected to the potential connected to the opposite supply voltage pole of the DC circuit.

The voltage divider circuit produces a measurement voltage ($U1_a, U1_b$) to the non-inverting input (+) of the comparator. In practice, the measurement voltage resistances (3a, 3b, 3c, 3d) in the voltage divider circuit are formed from several resistors connected in series within the limits of their power handling capacity and voltage strength. The connection operates as follows: when the fuse (7a,7b) is intact, the measurement voltage ($U1_a, U1_b$) is greater than the reference voltage ($U_{REF}a, U_{REF}b$), in which case the comparators' outputs correspond to the logic zero status. If either fuse blows out, the output of the comparator monitoring it will rise to logic status "1". The arrangement for monitoring two fuses comprises a simple logic element, formed with an "OR" operation, which indicates the blowing out of at least one of the two fuses and controls the indication element accordingly. Affordably, the indication element can include a relay and, for example, a red LED indicating a blown-out fuse. In addition, it is possible to connect a green LED to indicate that the DC voltage circuit is live, the fuse guard is working, and the fuse or fuses are intact.

Figure 2:
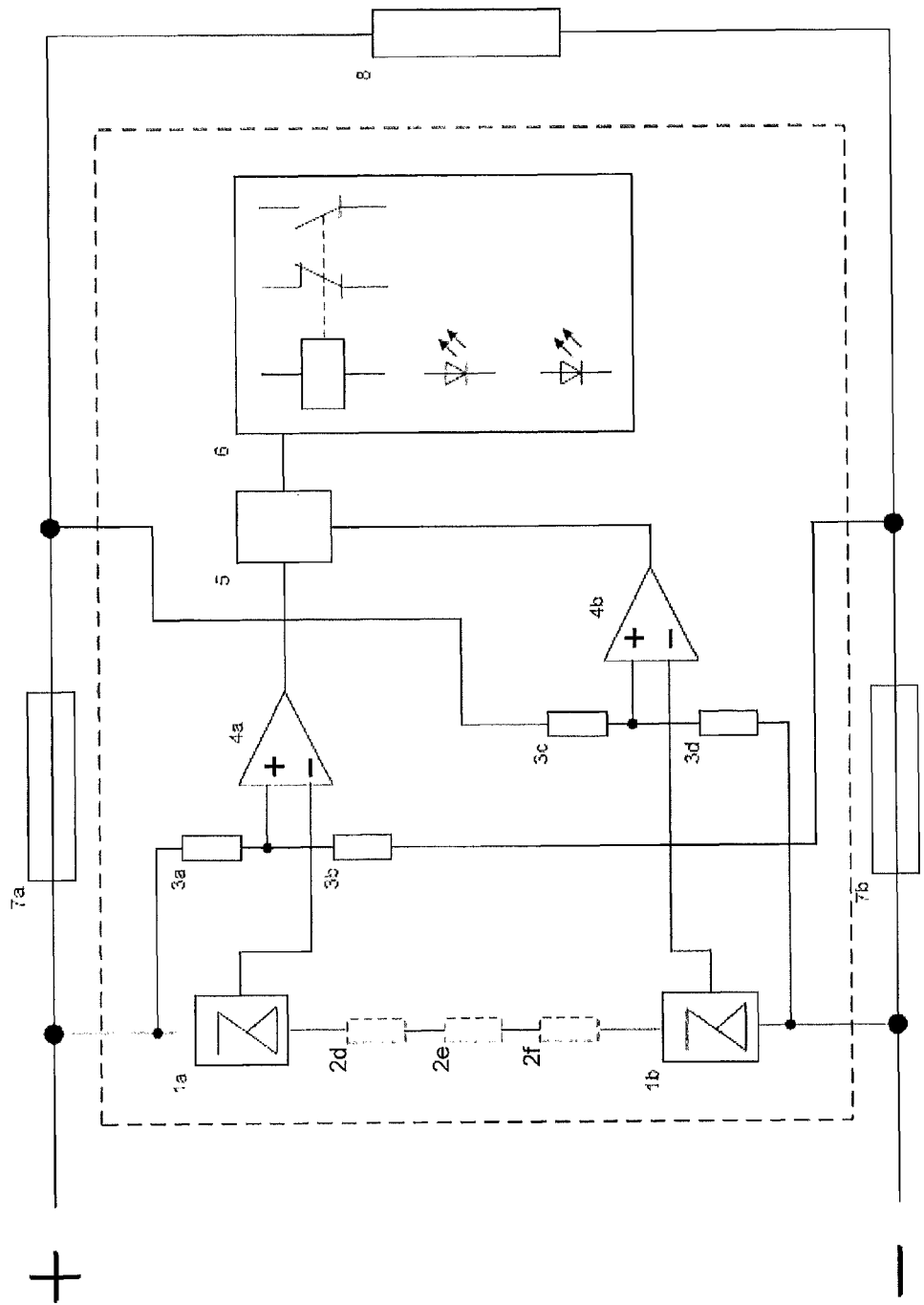
FIG. 2 illustrates an arrangement according to an exemplary embodiment, which includes a resistance chain in the reference and auxiliary voltage circuit, and the resistance chains operate as the voltage dividers of the measurement voltage.

FIG. 2 presents a solution in accordance with FIG. 1, except that the standard constant current power source or sources (2a,2b,2c) has been replaced with a voltage divider chain (2d,2e,2f). The connection is significantly simpler, since the constant current power source including several components is replaced only with a resistor. This connection is suitable for solutions in which the rated voltage range and its fluctuation range are very limited—for example, 110V±5%.

Figure 3:
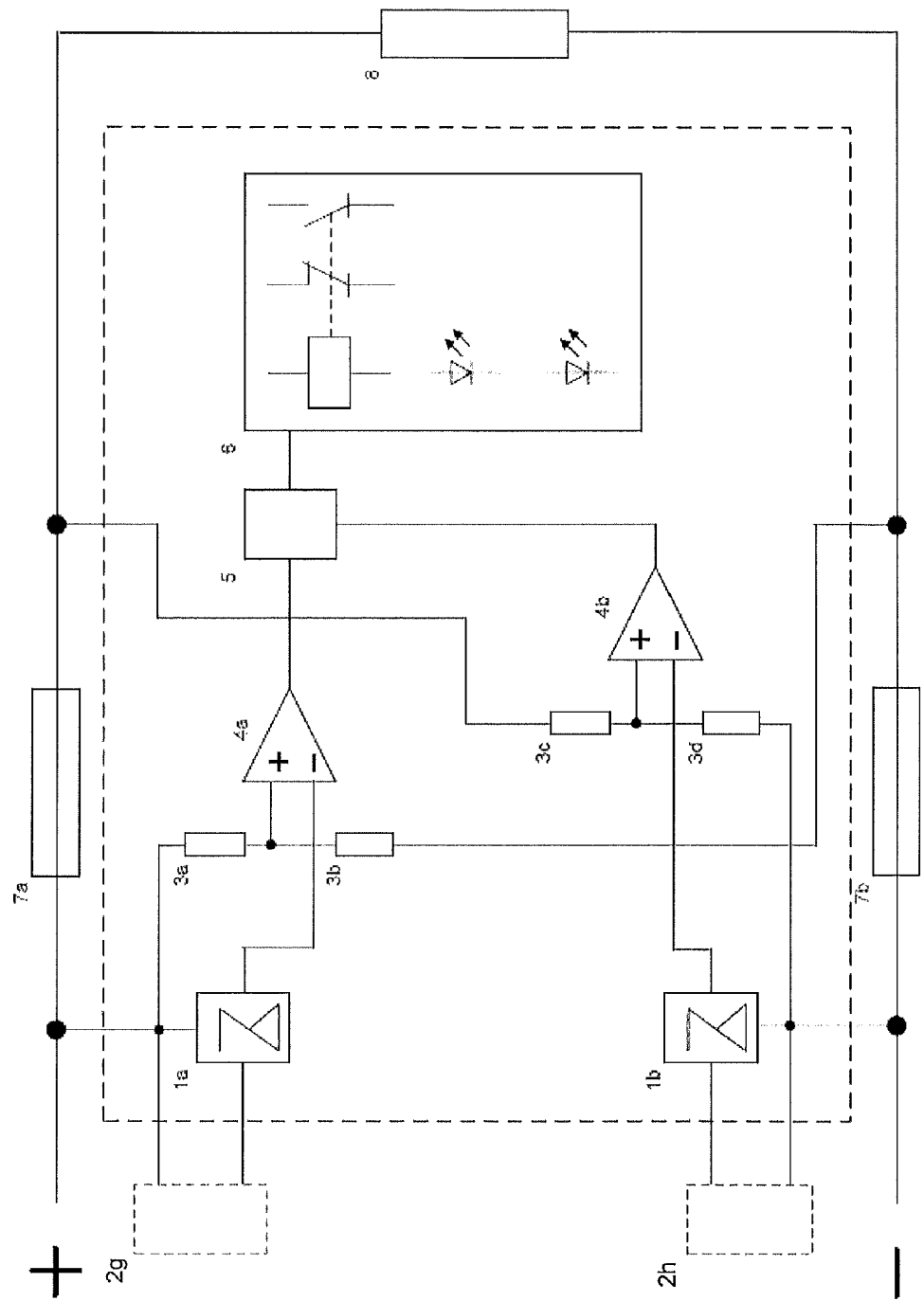
FIG. 3 illustrates an arrangement according to an exemplary embodiment, which includes external auxiliary voltage sources, and the resistance chains operate as the voltage dividers of the measurement voltage.

FIG. 3 illustrates a solution in accordance with FIG. 1, except that instead of the auxiliary power source coupling connected between the supply poles of the DC voltage circuit has been equipped with a separate auxiliary voltage source (2g,2h). The auxiliary voltage source can be a battery, an AC voltage-powered transformer and a rectifier connected to it, or a DC/DC converter supplied by a DC voltage circuit.

Figure 4:
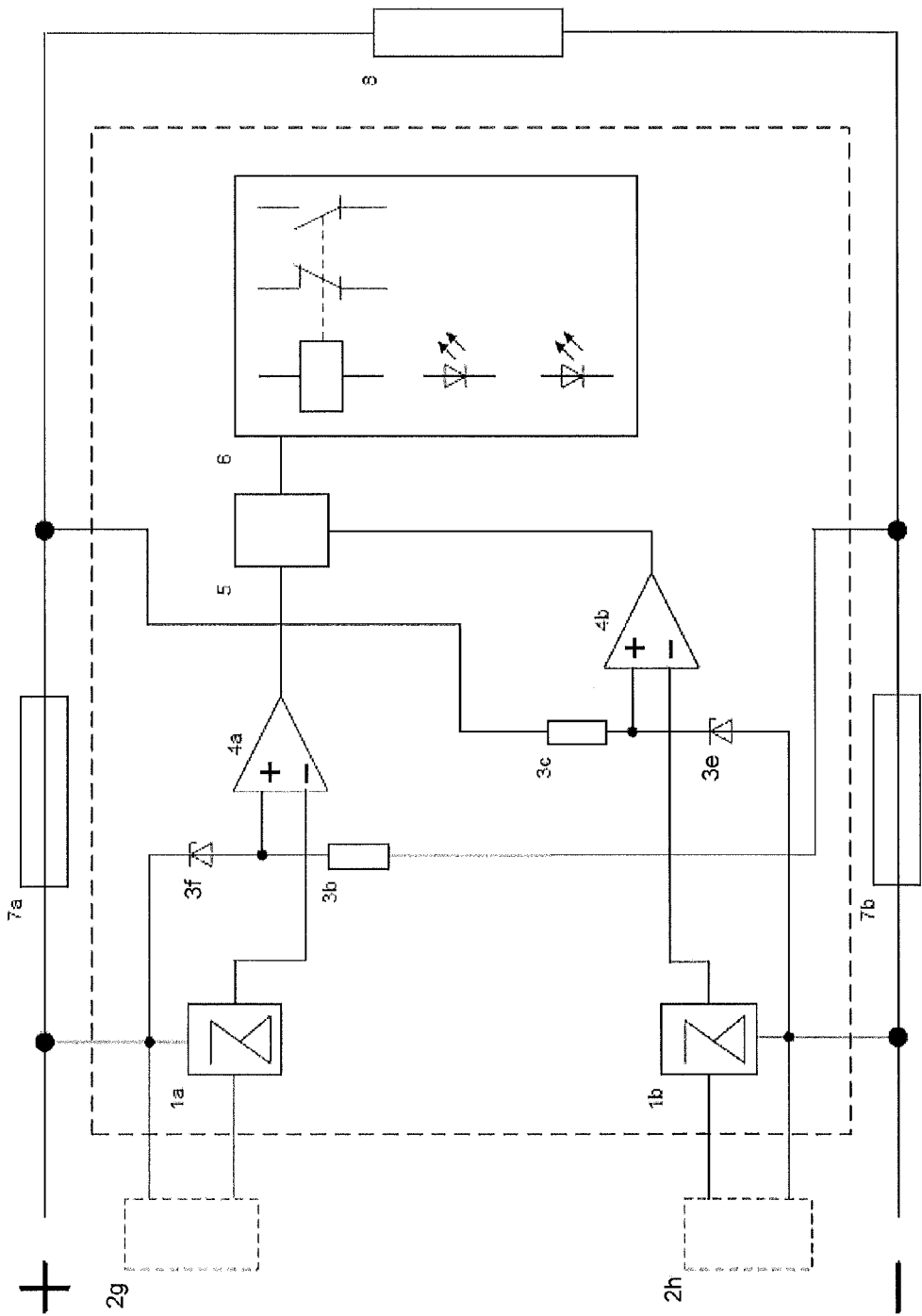
FIG. 4 illustrates an arrangement according to an exemplary embodiment, which includes external auxiliary voltage sources, and the zener-diode resistance chains operate as the voltage dividers of the measurement voltage.

FIG. 4 illustrates a solution in accordance with FIG. 3, except that the sub-resistance 3d of the first voltage divider circuit of measurement voltage has been replaced with a zener diode 3e, and the main resistance 3a of the second voltage divider circuit of the measurement voltage has been replaced with a zener diode 3f. In this case, when the monitored fuse is intact, the zener diode (3e,3f) defines the measurement voltage supplied to the comparator.

Figure 5:
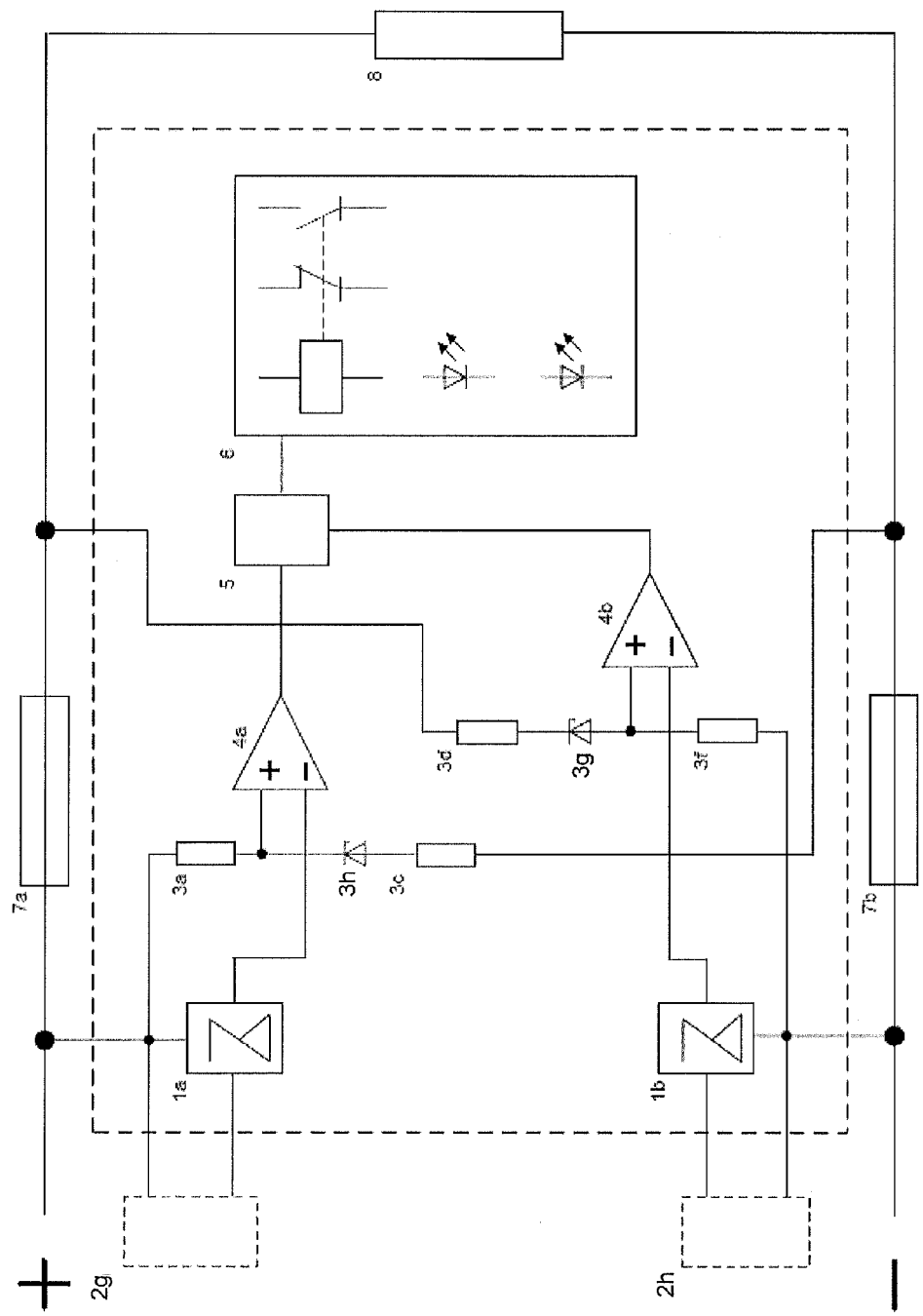
FIG. 5 illustrates an arrangement according to an exemplary embodiment, which includes external auxiliary voltage sources, and the resistance-zener-diode resistance chains operate as the voltage dividers of the measurement voltage.

FIG. 5 illustrates the solution in accordance with FIG. 3, except that a zener diode (3g,3h) has been connected in series with the resistance (3c,3d) of the voltage divider circuit of measurement voltage, and a zener voltage runs through the diode when the monitored fuse is intact. Depending on the supply voltage, the resistances of the voltage divider circuit define the circuit's current, which is adjusted high enough to make the zener diode work but low enough not to exceed the power handling capacity of the zener diode or cause unnecessary power consumption in serial resistances.

Figure 6:
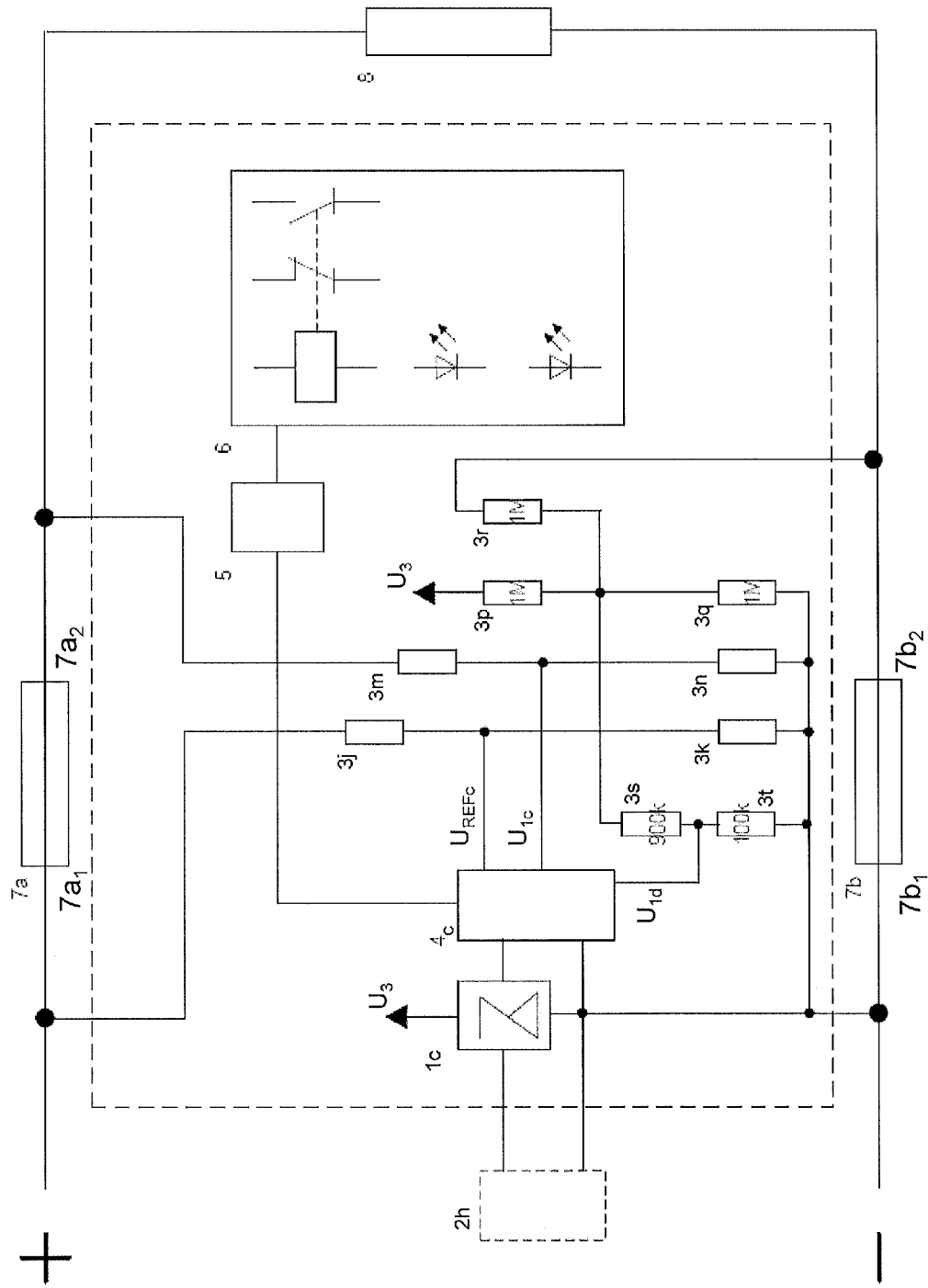
FIG. 6 illustrates an arrangement according to an exemplary embodiment, which includes external auxiliary voltage sources, a controller circuit as a comparison element, and the resistance chains operate as the voltage dividers of the measurement voltage.

FIG. 6 illustrates a connection which deviates from the previous figures in that the comparators are replaced by a controller circuit 4c including an analogue-digital converter. The figure presents a separate auxiliary voltage source 2h which feeds the supply voltage required by both the controller circuit 4c and the pull-up resistor 3p. In practice, the auxiliary voltage source can supply voltage through the zener power source 1c which stabilises the auxiliary voltage required by the controller circuit and creates a possibly different auxiliary voltage $U_3$ for the pull-up resistor 3p in the measurement voltage circuit used for monitoring the fuse 7b. The ground (i.e., 0V of the auxiliary voltage) is connected to the potential of the DC voltage supply circuit's negative pole.

Reference voltage $U_{REF}c$ is created with the voltage divider circuit (3j,3k) and supplied to the first input of the controller circuit's 4c A/D converter. A voltage divider chain (3m,3n) forming the measurement voltage has been connected to the output pole $7a_2$ of the first monitored fuse 7a.

The measurement voltage $U1_c$ is supplied from the intermediate output of the chain to the second input of the controller circuit's 4c A/D converter. The resistance 3r is connected to the output pole $7b_2$ of the second monitored fuse 7b. The other end of the resistance is connected to a connection point to which the other end of the pull-up resistor 3p, and the parallel sub-resistances, (i.e., the resistance 3q and the resistances (3s,3t), connected in parallel to it and in series with each other, forming a voltage distribution with the resistance 3r and the resistor 3p), are connected. From the intermediate point of the voltage distribution formed by the series-connected resistances (3s,3t), the measurement voltage $U1_d$ is supplied to the third input of the A/D converter of the controller. The controller circuit 4c controls the indication element 6 to indicate that one or two fuses have blown out. The controller circuit may also be equipped with a data transfer feature, such as an Ethernet interface, in which case the information on fuse condition can be transmitted through the data transfer network.

However, the controller circuit in FIG. 6 can be replaced with two linear comparators (4a, 4b) so that the reference voltage $U_{REFc}$ is connected to the inverting (−) input of the first comparator (4a) and the non-inverting (+) input of the second comparator (4b), and the intermediate output for resistances (3m, 3n) of the voltage divider circuit connected to the output (7a2) of the first fuse (7a) is connected to the non-inverting (+) input of the first comparator (4a), and the intermediate output between the resistances (3s,3t) of the voltage divider connection connected to the output (7b2) of the second fuse (7b) is connected to the inverting input of the second comparator (4b). The comparator outputs are connected to the logic element (5). The comparators (4a,4b) can be integrated to a single housing whose operating voltage, (e.g., connection's auxiliary voltage, as well as the reference voltage $U_{REFc}$), can also be supplied from the main circuit— for example, through the constant current power source and be regulated with a zener diode.

Figure 7:
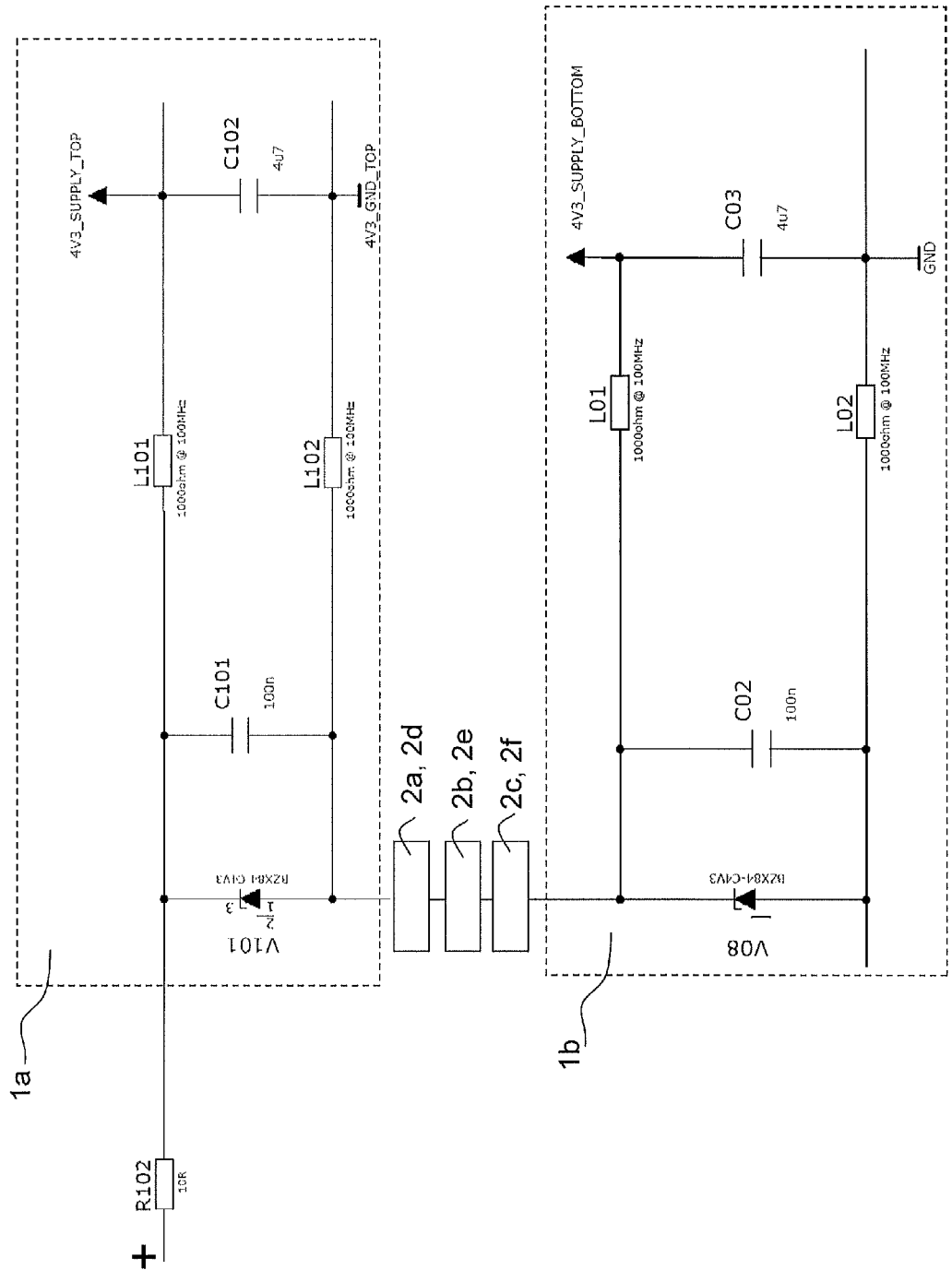
FIG. 7 illustrates, according to an exemplary embodiment, a circuit diagram to create the reference and auxiliary voltage.

FIG. 7 illustrates a circuit diagram for the series-connected auxiliary voltage sources (1a,1b) in a fuse guard monitoring two fuses in accordance with FIGS. 1 and 2. The circuit is supplied from the positive and negative poles of the DC voltage supply through fuse resistor R102.

The auxiliary voltage source includes a zener diode (V101,V08), and a voltage equal to the rated voltage runs through it. To remove high-frequency interference, an interference suppression capacitor (C101,C02) has been connected parallel to it. The ferrite-core interference suppression coils (L101,L01) and (L102,L02), and the filtering capacitor (C102,C03) are connected to the poles of the interference suppression capacitor.

Changes in the connection's zener current also cause changes to the voltage over it. For this, the capacitor (C102,C03) has been oversized in comparison to the load caused by the load, in which case the supply voltage stays as stable as possible despite the changes in the supply current. Using the coupling formed by the zener-based auxiliary voltage source and the constant current power sources, it is for example possible to realise the regulation of a low DC voltage in the connection of both supply poles (upper and lower part) in a high-voltage DC network.

Between the auxiliary voltage sources there are either constant current power sources (2a,2b,2c) or correspondingly resistances (2d,2e,2f) connected in series.

Figure 8:
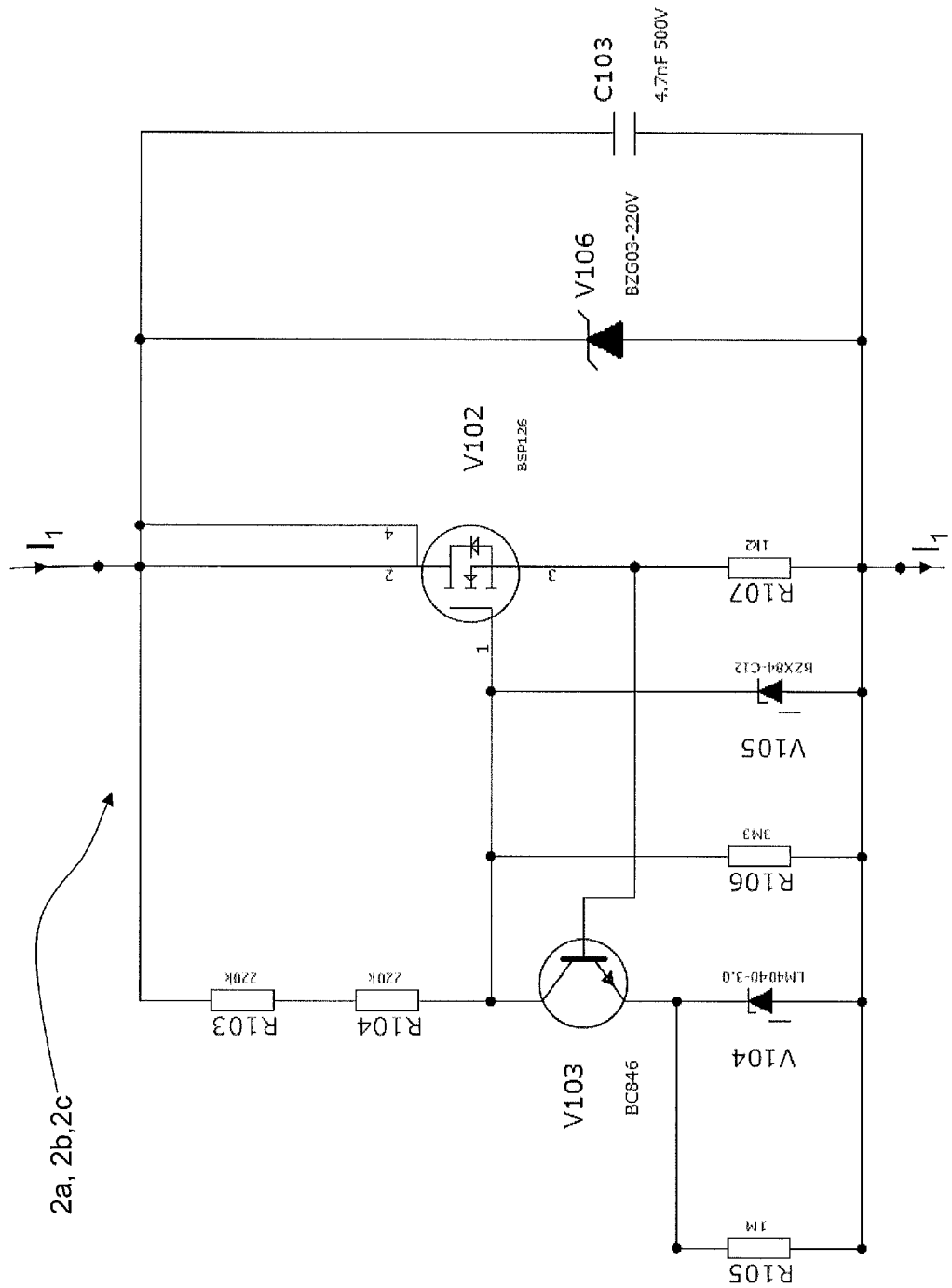
FIG. 8 illustrates, according to an exemplary embodiment, a circuit diagram to create the constant current power source.

FIG. 8 illustrates the circuit diagram of the constant current power source. It includes, together with the zener-based voltage regulation in accordance with FIG. 7, a voltage-insulation solution which is based on protective impedance created by the constant current power source (2a,2b,2c). Individual protective impedance has been realised with the constant current power source, which keeps the impedance constant in relation to the voltage over it. A chained connection using several constant current power sources creates the voltage distribution, which safely divides a high supply voltage to smaller proportions. Voltage division is based on the serial connection of constant current power sources with the same impedance value. This creates a basis for voltage insulation and the creation of an operating voltage.

The basic functionality of protective impedance is based on a constant current power source, which can have the following main components: FET transistor V102, FET transistor's overvoltage protector zener diode V106, filtering capacitor C103, current measurement resistor R107, and the rest of the auxiliary components, which create the control circuit of the connection.

In the connection illustrated in FIG. 8, the FET transistor V102 is a FET based on the enhancement-type. The FET's channel will open when the grid-emitter voltage reaches the positive opening voltage, which in this connection is about 2-4 V DC. The constant current is created by adjusting the grid-emitter voltage. The highest allowed collector-emitter voltage of FET in this connection is for example 240V DC, which limits the voltage range over one constant current power source. Voltage over an FET is also limited by the limits of safe operating voltage and operating current ranges defined for the component.

Connected in parallel with the FET transistor, is a 220 V DC zener diode which protects the FET and other components from overvoltage. The zener diode also operates as a spender of short circuit current and power in an overvoltage situation, and, for safety, it also operates as an alternative current route if the FET has been damaged so that it does not conduct current at all. If there is an FET short circuit, a single constant current power source does not create a voltage distribution in the connection at all, which leads to situation that the fuse resistor R102 will blow out. In a connection with several constant current power sources the fuse resistor will blow out when the supply voltage exceeds the sum of the threshold voltages of protective zener diodes V101 and V107.

The filtering capacitor C103 connected in parallel with the constant current power source operates as the stabilizer for the connection itself, as well as for the voltage distribution created by the constant current power sources. The capacitor also conducts high-frequency voltage and current transients through it, which helps to keep the voltage distribution more stable also during the momentary disturbance situations of the supply circuit.

The resistor R107 operates as the basic component of the constant current power source's control circuit, and the control circuit uses the voltage through the resistor to limit the base voltage of FET. The same voltage is also connected over the base emitter of transistor V103, and the voltage reference over V104. Transistor V103 is connected to the conducting state when the voltage of the resistor R107 exceeds the base and voltage reference voltages. When transistor V103 is conductive, it controls the grid-emitter voltage of FET's V102 towards the voltage level, in which case the FET limits its collector-emitter current. Based on this, the current of the constant current power source will be kept below a certain specified (e.g., maximum) value.

Noteworthy in the connection is the change of the FET's V102 grid-emitter voltage in relation to the current running through the resistor R107. The current running through the resistor R107 helps to decrease the FET's grid-emitter voltage, when potential in FET's emitter increases in relation to the earth ground of the constant current power source. In other words, the FET's grid-emitter voltage will decrease even if the transistor will not change the current running through itself.

The resistor R105 operates in the connection as the auxiliary current route for the transistor's base-emitter current in the start-up situation of the control circuit. A purpose of the voltage reference V104 is to stabilise the functionality of the connection in relation to temperature changes. At largest, the voltage variation of transistor V103's base emitter may be for example 0.4-0.8 V DC, in which case precise control in relation to the resistor R107 is not possible. This situation can be improved with a voltage reference, in which case the voltage variation the resistor R107 is for example between 3.4 and 3.8V DC, and the proportional effect of temperature to the limiting voltage will decrease.

Resistors R103, R104 and R106 are operating when forming the control voltage for the FET's grid-emitter voltage, when voltage is connected over the constant current power source.

When voltage increases, the voltage distribution created by resistors also increase the base-emitter voltage of the FET to the extent when the current running through the FET and resistor R107 starts to control the control circuit limiting the current. The division of resistors is placed so that the FET's grid-emitter voltage will increase, using the smallest possible supply voltage value, to the threshold voltage, which makes it possible to achieve the desired current value already during the start-up.

The zener diode V105 operates as the limiter of the FET's base-emitter voltage in a situation in which the control circuit cannot limit it. This situation is possible when a voltage high enough to connect the protective zener diode V106 to a conductive state is connected over the constant current power source. In the conductive situation, the protective zener diode operates as a non-limiting element in the connection, in which case no limiting voltage will be created over resistor R107. However, resistors R103, R104 and R106 aim to raise the FET's grid-emitter voltage in accordance with the resistor division. However, the resistor division will cause too high a voltage to the FET's grid-emitter section, so it should be limited with the zener diode V105.

The connection based on the protective impedance chain consumes little power if the power feed specification of voltage sources is not extensive. The constant current chain supports well the variation of supply voltage because it adjusts its protective impedance automatically according to the voltage over it. In a similar transformer connection a wide-range voltage variation may be a problem. When realised with transformer and/or chopper technology, the connection can include secondary coils with a high isolation capability in the low and high ends of the voltage supply.

Figure 9:
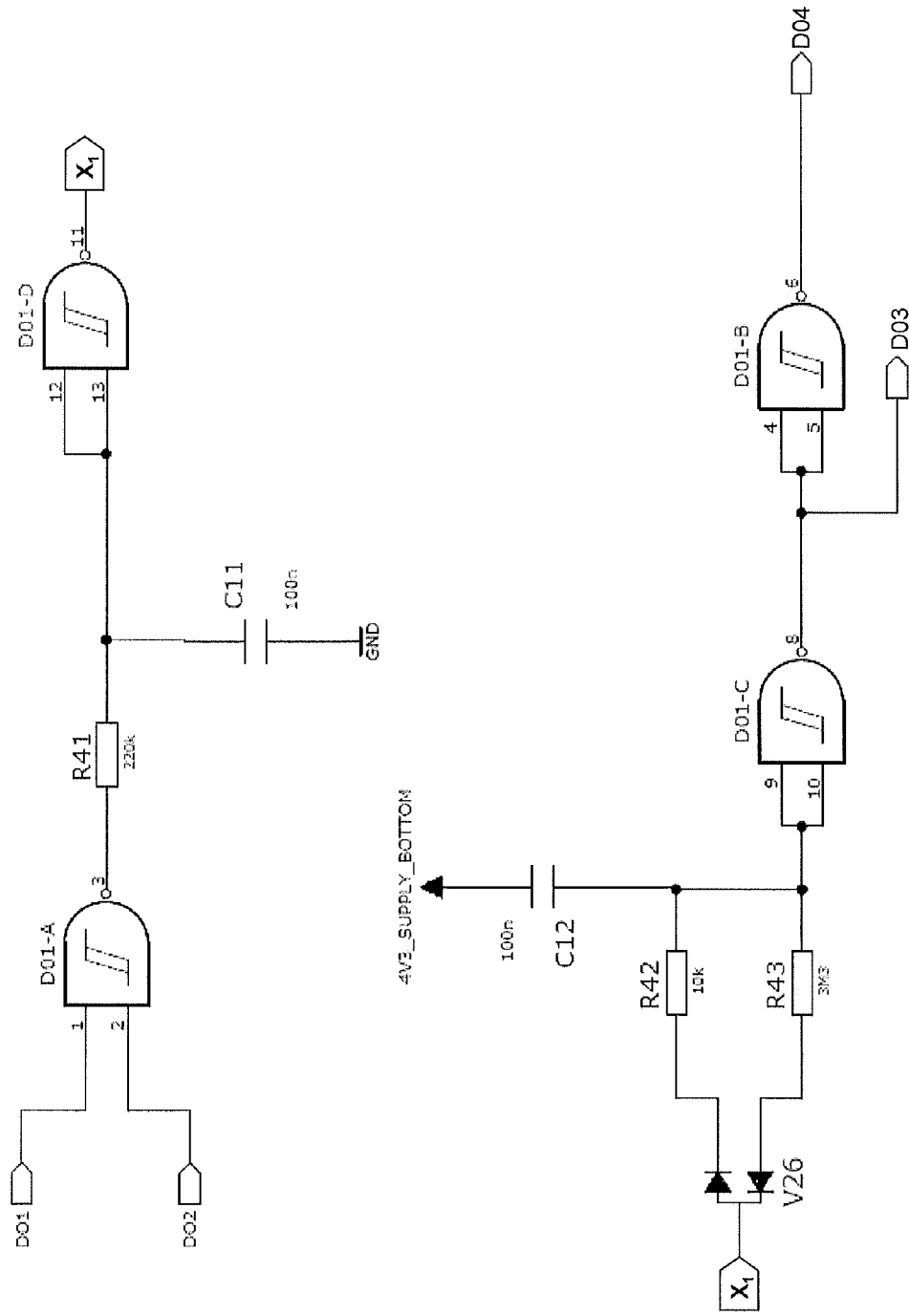
FIG. 9 illustrates, according to an exemplary embodiment, a circuit diagram to create the logic element.

FIG. 9 illustrates the structure of a logic part. When more than one fuse is monitored with separate comparators, the logic element 5 can be used to create a logical "OR" operation between their outputs. This can be easily achieved with an NAND logic circuit equipped with the Schmitt trigger inputs.

The output D01 of the first comparator and the output D02 of the second comparator are connected to the inputs (1,2) of the block D01-A in the logic circuit D01. To be prepared for short-term error pulses, an RC filter has been arranged, with resistor R41 and capacitor C11, between the parallel-connected inputs (12,13) of the output channel (3) in the NAND block D01-A and the following block D01-D. A dual opposite-parallel diode (V26) has been connected to the output (11) of the block D01-D. The resistors (R42, R43), connected together from the other end, are connected to the poles of the dual diode, and a pull-up capacitor (C12) has been connected to this connection point, and this point has been connected to the inputs (9,10) of the following NAND block D01-C. This connection creates a delay which starts from the moment the voltage is switched on. During this delay, the high-capacity filter capacitor, arranged to feed the indication unit (6) relay, has time to get charged before the fuse guard is ready to operate.

During the abovementioned delay, the output (8) of the NAND block D01-C remains in the logical "0" state, in which case the signal level of the pole D03 controlling the relay of the indication element 6 and the red LED signal light keeps low, and the signal level of the pole D04 controlled by the output (6) of the last NAND block D01-B keeps high in the logical state "1" and lights up the green LED signal light of the indication element.

FIG. 9 does not illustrate the function of indication unit 6, but the relay and the LED signal lights can be controlled with a simple transistor connection.

An exemplary embodiment can include an arrangement to monitor the condition of the DC voltage circuit fuse (7a,7b), which arrangement can include means to create a reference voltage ($U_{REF}a, U_{REF}b, U_{REF}c$), to create the measurement voltage ($U_{1a}, U_{1b}, U_{1c}, U_{1d}$) of the voltage divider circuit (3a, . . . , 3h, 3m, . . . , 3t) connected between the fuse output pole (7a2,7b2) and the adjacent supply pole (−,+), and a comparison element to compare the mentioned voltages and to control an indication element, such as a relay or signal light.

The comparison element (4a,4b) can be a linear comparator or a controller circuit equipped with an analogue-digital converter. In an exemplary embodiment, the arrangement includes a voltage divider connection (1a,1b,2a,2b,2c) for forming the reference voltage and the auxiliary voltage for the circuit. The connection includes at least one constant current power source connection (2a,2b,2c). The arrangement can include the reference voltage of an external auxiliary voltage source (2g, 2h) and a circuit to create the auxiliary voltage. The arrangement can include means to monitor the fuse connected to the positive and negative poles of the DC voltage circuit, and a logic device to connect the outputs of comparison elements with a logical "OR" operation.

The embodiments are related to the arrangement to monitor the condition of the DC voltage circuit, which arrangement includes the first and second supply poles to create the operating voltage of the DC circuit, the first fuse (7a) connected to the first supply pole, which first fuse has the supply pole (7a1) and output pole (7a2), a fuse (7b) connected to the second supply pole, which second fuse has the input pole (7b1) and the output pole (7b2). In an exemplary embodiment, one or several reference voltages ($U_{REF}a, U_{REF}b, U_{REF}c$) are formed, wherein the first measurement voltage ($U_{1a}, U_{1b}, U_{1c}, U_{1d}$) is formed between the output pole (7a2) of the first fuse and the supply pole (7b1) of the second fuse, and the second measurement voltage ($U_{1a}, U_{1b}, U_{1c}, U_{1d}$) is formed between the output pole and the second connection point of the second fuse, which second connection point is either the supply pole of the first fuse or the supply pole of the second fuse. The exemplary embodiments can compare one or several reference voltages and measurement voltages to estimate the condition of the first or second fuse, and indicate the comparison result.

If more than one reference voltage is created, in an exemplary embodiment the reference voltages are equal.

In an exemplary embodiment, the mentioned or several reference voltages and/or the auxiliary voltage of the DC circuit can be created from the operating voltage between the first and the second supply poles, that is, the circuit is connected between the input poles of fuses. In another exemplary embodiment, one or several external power sources are used to create one or several reference voltages and/or the auxiliary voltage of the DC circuit.

According to exemplary embodiments, the comparison of one or more reference voltages and the measurement voltage can be realised in different ways. In an exemplary embodiment, the measurement circuit uses only one comparison unit, which receives one reference voltage and compares it to both measurement voltages.

In another exemplary embodiment, two comparison devices, such as comparators, are used for comparison. Separate reference voltages or the same reference voltage can be conducted for them.

In an exemplary embodiment, the arrangement can include a constant current power source connection to create the reference voltage and/or the auxiliary voltage, and to limit the increase of power losses at the higher end of the operating voltage range. In another exemplary embodiment, the arrangement includes a resistive connection to create the reference voltage and/or the auxiliary voltage.

In an exemplary embodiment the constant current power source connection or resistive connection is connected to the first and the second supply poles of the DC voltage circuit. The constant current power source connection or the resistive connection is connected in series with one or several auxiliary voltage sources. The connection can be made, for example, so that the serial connection of one or more constant current power sources has been connected in series with the auxiliary voltage sources, so that the auxiliary voltage sources are located in both ends of the constant current power sources.

In an exemplary embodiment, the first and/or the second measurement voltage is created with the voltage divider circuit including one or several resistors.

In an exemplary embodiment, the comparison is performed using the first linear comparator ($4a$) to monitor the condition of the first fuse, and using the second linear comparator ($4b$) to monitor the condition of the second fuse. A logic circuit can be connected to the first and the second linear comparators, which logic circuit has been arranged to indicate a damaged fuse if the output of one or several linear comparators indicates a damaged fuse. The indication means to indicate a damaged fuse can be arranged to operate jointly with the logic circuit or controller circuit so that the fault is indicated if one or both fuses are damaged.

Exemplary embodiments can also encompass a method to monitor the condition of two fuses.

The exemplary embodiments described herein are not meant to limit the invention but only to clarify basic ideas of the invention. Within the limits of technical functionality, the features presented in different figures can be connected also otherwise than presented in the figures. It is clear that details may vary within the limits of patent requirements.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. An arrangement for monitoring a condition of a direct current voltage circuit, the arrangement comprising:
    a first supply pole and a second supply pole for forming an operating voltage for the direct current voltage circuit;
    a load connected between the first supply pole and the second supply pole;
    a first fuse connected between the first supply pole and the load, which first fuse includes a input pole and an output pole;
    a second fuse connected between the second supply pole and the load, which second fuse includes a input pole and an output pole;
    means for forming one or several reference voltages ($U_{REF}a$ $U_{REF}b$, $U_{REF}c$);
    means for forming a first measurement voltage ($U_{1a}$, $U_{1b}$, $U_{1c}$, $U_{1d}$) between the output pole of the first fuse and the input pole of the second fuse;
    means for forming a second measurement voltage ($U_{1a}$, $U_{1b}$, $U_{1c}$, $U_{1d}$) between the output pole of the second fuse and the input pole of the first or second fuse;
    means for comparing one or several reference voltages and measurement voltages to assess conditions of the first and the second fuses; and
    means for indicating a result of the comparing.

2. An arrangement according to claim 1, comprising:
    means for forming one or several reference voltages and/or an auxiliary voltage of the direct current voltage circuit from an operating voltage between the first and the second supply poles.

3. An arrangement according to claim 1, comprising:
    one or several external power supplies for forming one or several reference voltages and/or an auxiliary voltage of the direct current voltage circuit.

4. An arrangement according to claim 1, wherein the comparing means is configured to compare one reference voltage to the first and the second measurement voltages.

5. An arrangement according to claim 1, wherein the means for forming reference voltages comprises:
    means for forming a first reference voltage and means for forming a second reference voltage.

6. An arrangement according to claim 1, wherein the comparing means comprise:
    a first comparison unit to compare a first reference voltage to the first measurement voltage, and a second comparison unit to compare a second reference voltage to the second measurement voltage.

7. An arrangement according to claim 1, comprising:
    an auxiliary voltage source to create a reference voltage from an operating voltage or an external voltage source.

8. An arrangement according to claim 1, comprising:
    a constant current power source connection, which is connected in series with one or several auxiliary voltage supplies for forming the reference voltage and/or an auxiliary voltage and to limit an increase of power losses at a higher end of an operating voltage range.

9. An arrangement according to claim 1, comprising:
    a resistive connection, which is connected in series with one or several auxiliary voltage sources for forming the reference voltage and/or an auxiliary voltage.

10. An arrangement according to claim 1, comprising:
    one or several auxiliary voltage sources, connected in series with a constant current power source connection or resistive connection, and connected to the first and the second supply poles of the direct current voltage circuit.

11. An arrangement according to claim 1, wherein the comparing means for forming the first measurement voltage and/or the second measurement voltage comprise:
a voltage divider circuit which includes one or several resistors.

12. An arrangement according to claim 1, wherein the indicating means are arranged to indicate a fuse fault if one or several fuses are damaged.

13. An arrangement according to claim 1, wherein the comparing means comprise:
a first linear comparator for monitoring a condition of the first fuse;
a second linear comparator for monitoring the condition of the second fuse; and
a logic circuit connected to the first and the second linear comparators, which logic circuit is arranged to indicate a faulty fuse when an output of one or several linear comparators indicates a faulty fuse.

14. An arrangement according to claim 1, wherein the comparing means comprise:
a controller circuit equipped with an analogue-digital converter, arranged to compare one incoming reference voltage to the first and the second measurement voltages.

15. A method for monitoring a condition of a direct current voltage circuit, comprising:
forming an operating voltage of a direct current voltage circuit between a first supply pole and a second supply pole, a first fuse being connected between the first supply pole and a load, which first fuse has a input pole and an output pole, and a second fuse being connected between the second supply pole and a load, which second fuse has a input pole and an output pole;
forming one or several reference voltages ($U_{REF}a, U_{REF}b, U_{REF}c$);
forming a first measurement voltage ($U_{1a}, U_{1b}, U_{1c}, U_{1d}$) between the output pole of the first fuse and the input pole of the second fuse;
forming a second measurement voltage between the output pole of the second fuse and the input pole of the first or the second fuse;
comparing one or several reference voltages and measurement voltages for estimating a condition of the first and second fuses; and
indicating a result of the comparing.

16. An arrangement according to claim 2, comprising:
one or several external power supplies for forming one or several reference voltages and/or the auxiliary voltage of the direct current voltage circuit.

17. An arrangement according to claim 16, wherein the comparing means is configured to compare one reference voltage to the first and the second measurement voltages.

18. An arrangement according to claim 17, wherein the means for forming the reference voltage comprises:
means for forming a first reference voltage and means for forming a second reference voltage.

19. An arrangement according to claim 18, wherein the comparing means comprise:
a first comparison unit to compare the first reference voltage to the first measurement voltage, and a second comparison unit to compare the second reference voltage to the second measurement voltage.

20. An arrangement according to claim 19, comprising:
an auxiliary voltage source to create a reference voltage from an operating voltage or an external voltage source.

* * * * *